United States Patent
Suzuki et al.

(10) Patent No.: US 12,501,221 B2
(45) Date of Patent: Dec. 16, 2025

(54) TRANSDUCER

(71) Applicant: ROHM CO., LTD., Kyoto (JP)

(72) Inventors: Tatsuya Suzuki, Kyoto (JP); Yoshikazu Fujimori, Kyoto (JP); Noriyuki Shimoji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 294 days.

(21) Appl. No.: 18/319,234

(22) Filed: May 17, 2023

(65) Prior Publication Data

US 2023/0292055 A1 Sep. 14, 2023

Related U.S. Application Data

(63) Continuation of application No. PCT/JP2021/039628, filed on Oct. 27, 2021.

(30) Foreign Application Priority Data

Dec. 1, 2020 (JP) .................. 2020-199459

(51) Int. Cl.
*H04R 17/02* (2006.01)
*H04R 7/04* (2006.01)
*H04R 7/18* (2006.01)

(52) U.S. Cl.
CPC ............... *H04R 17/02* (2013.01); *H04R 7/04* (2013.01); *H04R 7/18* (2013.01); *H04R 2201/003* (2013.01)

(58) Field of Classification Search
CPC .......... B81B 3/00; H10N 30/20; H10N 30/30; H10N 30/853; H10N 30/88; H04R 17/02;
(Continued)

(56) References Cited

U.S. PATENT DOCUMENTS 7,540,194 B2 * 6/2009 Sugiura ................. G01S 15/931
367/87
8,854,772 B1 10/2014 Setiadi et al.

FOREIGN PATENT DOCUMENTS

JP S59-61698 U 4/1984
JP 2001-069596 3/2001
(Continued)

OTHER PUBLICATIONS

Translation of WIPO application WO 2018215669 A2 (Year: 2018).*
(Continued)

*Primary Examiner* — Brian Ensey
(74) *Attorney, Agent, or Firm* — HSML P.C.

(57) ABSTRACT

A transducer includes a substrate containing silicon and a piezoelectric element disposed on the substrate. The substrate includes a film body including a first surface and a second surface facing in mutually opposite directions in a thickness direction of the substrate and a frame body surrounding the film body when the film body is viewed from the thickness direction. The piezoelectric element is disposed on the first surface of the film body. A part of an outer edge of the film body when viewed from the thickness direction forms a connection portion connected to the frame body, and a remaining part of the outer edge excluding the connection portion is separated from the frame body. The substrate includes a protrusion protruding in the thickness direction from a region including at least a part of the remaining part of the outer edge of the second surface.

16 Claims, 12 Drawing Sheets

(58) Field of Classification Search
CPC ...... H04R 7/04; H04R 7/18; H04R 2201/003; H04R 17/00
See application file for complete search history.

(56) References Cited

FOREIGN PATENT DOCUMENTS

| | | |
|---|---|---|
| JP | 2014-225317 | 12/2014 |
| JP | 2019-161030 | 9/2019 |
| WO | 2018/061805 | 4/2018 |

OTHER PUBLICATIONS

International Search Report and Written Opinion of PCT/JP2021/039628, Jan. 11, 2022, 9 pages including English translation of the International Search Report.
Japanese Office Action issued in JP 2022-566785, dated Sep. 16, 2025, 6 pages, English machine translation provided.

\* cited by examiner

TRANSDUCER

CROSS REFERENCE TO RELATED APPLICATIONS

This application is a continuation application of International Application No. PCT/JP2021/039628, now WO2022/118575, filed on Oct. 27, 2021, which claims priority to Japanese Patent Application No. 2020-199459, filed on Dec. 1, 2020, the entire contents of which are incorporated by reference herein.

BACKGROUND OF THE INVENTION

Technical Field

The embodiments herein relate to a transducer.

Background

A transducer is known as one of a variety of micro-electro-mechanical systems (MEMS) manufactured by using semiconductor manufacturing processes. A MEMS transducer includes a piezoelectric element and a film body driven by means of the piezoelectric element, and is housed in a portable electronic device case or the like as a speaker or microphone, for example (see WO 2018/061805).

SUMMARY OF THE INVENTION

A film body constituting a transducer is sometimes formed as a cantilever. That is, one end (i.e., a base end) of the film body is supported by a support member as a fixed end, and the other end (i.e., a tip) of the film body is formed as a free end. The outer edge of the film body other than the part supported by the support member is separated slightly from the support member. Due to the vibration of the film body, gas flows from a gap between the outer edge of the film body and a member such as the support member which faces the outer edge. The change in pressure due to the flow of this gas has a phase which is the opposite of the phase of a change in sound pressure generated by the film body and acts to cancel this sound pressure. Therefore, if the flow of the gas described above is excessively large, the sound pressure that should be obtained originally may not be obtained and the reproducibility of sound may deteriorate.

In addition, a film body formed as a cantilever is likely to warp due to film stress from a piezoelectric element disposed on a surface of the film body and a protection film of the piezoelectric element. If this warpage is excessively large, the amplitude of the vibration of the film body (the piezoelectric element) is limited. Therefore, in this case also, the sound pressure that should be obtained originally may not be obtained, and the reproducibility of sound may deteriorate.

An object of the embodiments herein is to provide a transducer capable of enhancing the reproducibility of sound.

One aspect of the embodiments herein provides a transducer including: a substrate containing silicon; and a piezoelectric element disposed on the substrate. The substrate includes: a film body including a first surface and a second surface facing in mutually opposite directions in a thickness direction; and a frame body surrounding the film body when the substrate is viewed from the thickness direction. The piezoelectric element is disposed on the first surface of the film body, a part of an outer edge of the film body when viewed from the thickness direction forms a connection portion connected to the frame body, and a remaining part of the outer edge excluding the connection portion is separated from the frame body. The substrate includes a protrusion protruding in the thickness direction from a region including at least a part of the remaining part of the outer edge of the second surface.

The substrate may include a semiconductor layer and an oxide layer that are laminated on each other in the thickness direction. The transducer may further include a lid body that is attached to the frame body and covers the first surface of the film body with a space between the lid body and the first surface of the film body. The lid body may include an opening overlapped with at least a part of the piezoelectric element when viewed from the thickness direction.

The protrusion may be disposed at an opposite portion of the outer edge that is located at the opposite side of the film body to the connection portion of the remaining part of the outer edge. The substrate may include a reinforcing portion that protrudes from the second surface in the thickness direction and is connected to the protrusion. The protrusion may be disposed along the entire remaining part of the outer edge. The protrusion may include a plurality of protruding cells divided along the outer edge. A planar shape of the protrusion viewed from the thickness direction may be a linearly symmetric shape having, as an axis of symmetry, a straight line which connects a center of the connection portion and a center of the opposite portion of the outer edge facing the connection portion. A height of the protrusion in the thickness direction may be 3 μm or more. A maximum length of the protrusion in a direction parallel to the second surface of the film body may be 10 μm to 100 μm. The piezoelectric element may be disposed on the frame body and the film body so that the piezoelectric element spans the connection portion. When the film body is viewed from the thickness direction, a part of the oxide layer may be overlapped with the protrusion. A part of the oxide layer may be included in the protrusion. The lid body may be attached to the frame body with a protection film formed on the substrate therebetween. The protection film may include a first protection film covering the piezoelectric element and a surface of the frame body around the piezoelectric element, and a second protection film covering a region of the surface of the frame body other than a region including the film body and the piezoelectric element. The first protection film may contain alumina as a component. The second protection film may contain tetraethoxysilane as a component.

According to the embodiments herein, it is possible to provide a transducer capable of enhancing the reproducibility of sound.

BRIEF DESCRIPTION OF THE DRAWINGS

FIG. 6A is a diagram showing the change in a neutral position of an opposite portion according to the area of the piezoelectric element, and FIG. 6B is a diagram showing the change in the neutral position of the opposite portion according to the thickness of the protection film.

DESCRIPTION OF THE EMBODIMENTS

Figure 1A:
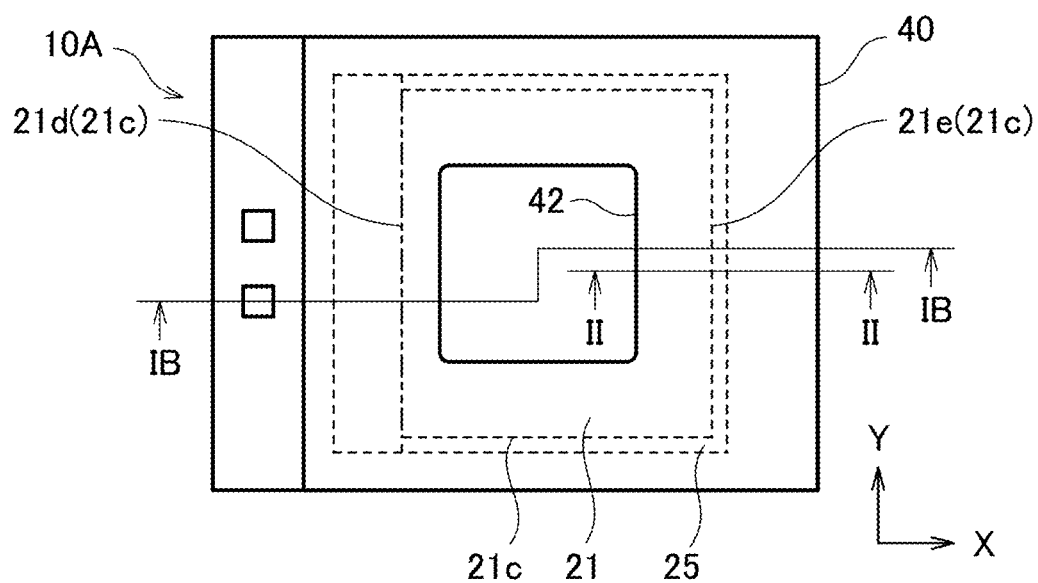
FIG. 1A is a top view of a transducer according to a first embodiment.

Embodiments will be described using drawings. Structurally or functionally identical parts in each embodiment are denoted by the same reference numerals in the drawings, and duplicate explanations regarding such parts are omitted.

Each embodiment is a micro-electro-mechanical systems (MEMS) structure having a film body configured to be displaceable (flexible, strainable) and can be applied to transducers such as a speaker and a microphone that use a piezoelectric element to control or detect the displacement (flexure, strain, vibration) of the film body.

First Embodiment

Figure 1B:
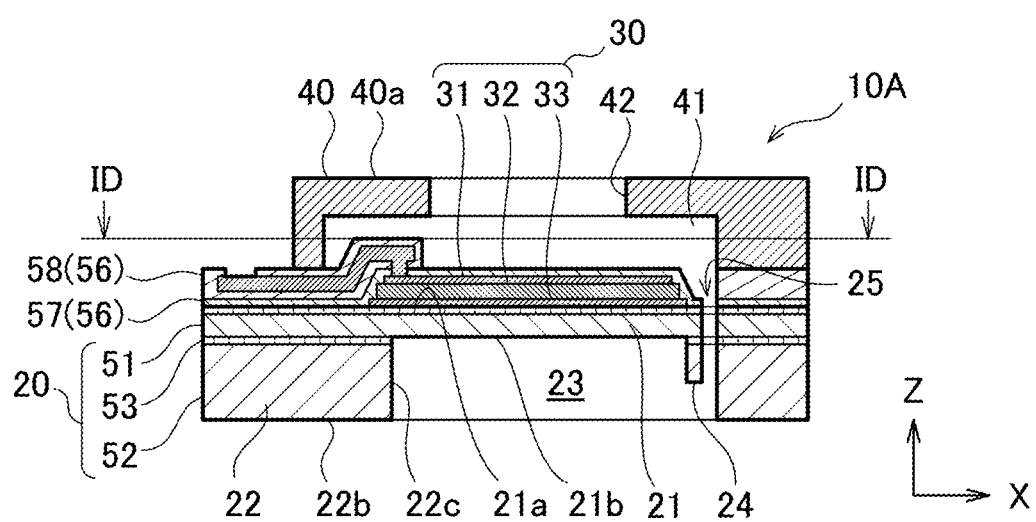
FIG. 1B is a cross-sectional view of the transducer which is taken along line IB-IB in FIG. 1A.
Figure 1C:
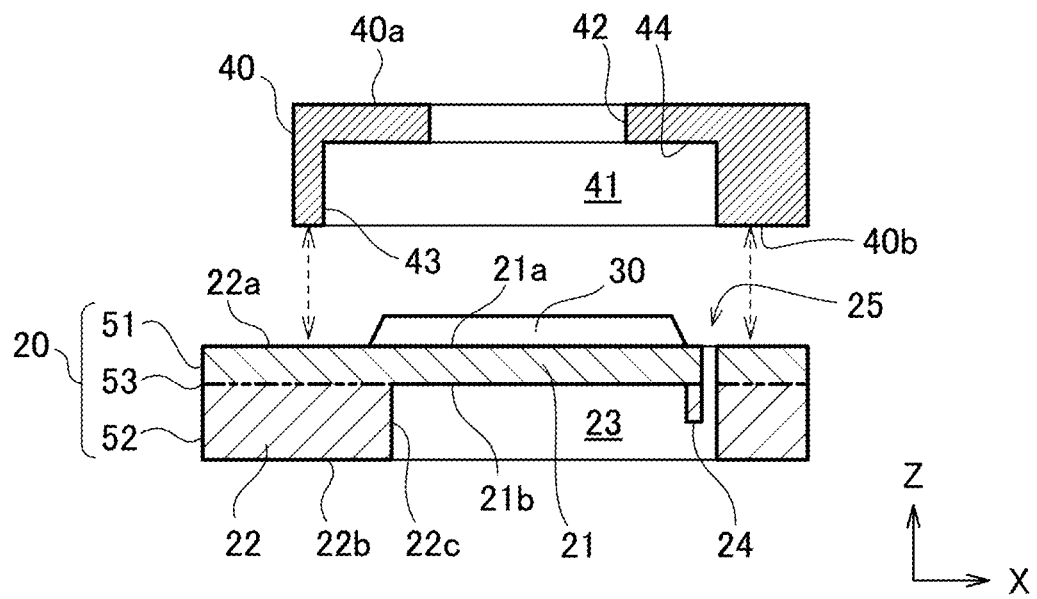
FIG. 1C is an exploded view of a simplified configuration of FIG. 1B.
Figure 1D:
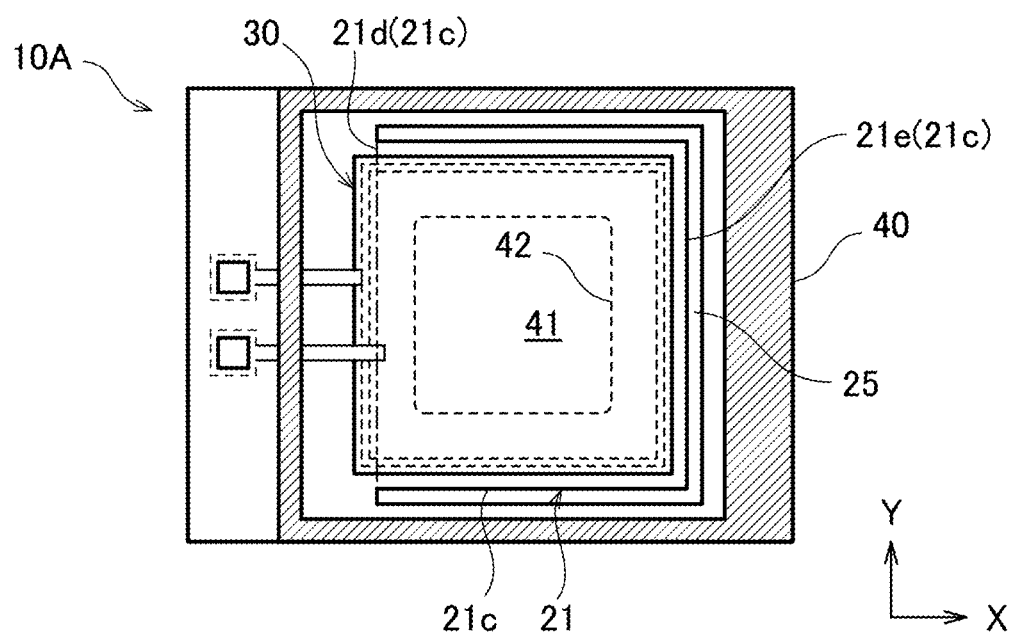
FIG. 1D is a cross-sectional view of the transducer which is taken along line ID-ID in FIG. 1B.

The configuration of a transducer 10A according to a first embodiment be described. FIG. 1A is a top view of the transducer 10A, and FIG. 1B is a cross-sectional view of the transducer which is taken along line IB-IB in FIG. 1A. FIG. 1C is an exploded view of the simplified configuration of FIG. 1B, and FIG. 1D is a cross-sectional view of the transducer which is taken along line ID-ID in FIG. 1B.

As shown in FIGS. 1A to 1D, the transducer 10A includes a substrate 20 containing silicon, a piezoelectric element 30 arranged on the substrate 20, and a lid body 40. The substrate 20 includes a film body 21 which has a front surface (a first surface) 21a and a back surface (a second) 21b that faces in mutually opposite directions in a thickness direction, and a frame body (a support portion) 22 which is provided around the film body 21 and is connected to a part of an outer edge 21c of the film body 21. The frame body 22 surrounds the film body 21 when the film body 21 is viewed from the thickness direction of the film body 21.

The piezoelectric element 30 is disposed on the front surface 21a of the film body 21 and controls or detects the displacement of the film body 21 in the Z direction. That is, when the transducer 10A is used as a speaker, the piezoelectric element 30 vibrates the film body 21 in the Z direction. Meanwhile, when the transducer 10A is used as a microphone, the piezoelectric element 30 detects the displacement of the film body 21.

The substrate 20 is a silicon-on-insulator (SOI) substrate that includes an active layer 51 which is a semiconductor layer, a support layer 52 which is a semiconductor layer, and an interlayer insulating layer (a BOX layer, an oxide layer) 53 which is interposed between the active layer 51 and the support layer 52. The active layer 51, the interlayer insulating layer 53, and the support layer 52 are sequentially laminated in the Z direction. That is, the semiconductor layers and the oxide layer are laminated on one another in the Z direction. The film body 21 is formed from the active layer 51, for example. The frame body 22 is formed from the active layer 51, the interlayer insulating layer 53, and the support layer 52, for example. However, it is sufficient if the substrate 20 is a substrate containing silicon, and the substrate is not limited to an SOI substrate. That is, the substrate 20 may be a silicon substrate without an interlayer insulating layer. An oxide film 54 is formed on the front surface 20a of the substrate 20, which is the outer surface of the active layer 51. An oxide film 55 is formed on the back surface 20b of the substrate 20, which is the outer surface of the support layer 52 (see FIG. 4A).

Hereinafter, for convenience of the explanation, the lamination direction of the active layer 51, the support layer 52, and the interlayer insulating layer 53 is defined as the Z direction, and two directions which are perpendicular to the Z direction and are perpendicular to each other are defined as the X and Y directions. The Z direction is also the thickness direction of each of the substrate 20, the piezoelectric element 30, and the film body 21, and is also the direction in which the substrate 20 and the lid body 40 are laminated.

The film body 21, the frame body 22, and a protrusion 24 which will be described later are integrally formed from the substrate 20 which is a single member.

The film body 21 is a thin film that expands in the X and Y directions and has a thickness (for example, 2 to 3 μm) in which the film body is displaceable (flexible, strainable) in the Z direction. In addition, the film body 21 has the front surface (the first surface) 21a and the back surface (the second surface) 21b facing in mutually opposite directions in the Z direction. The front surface 21a faces the lid body 40. The back surface 21b faces a space 23. When the substrate 20 is an SOI substrate, the back surface 21b of the film body 21 may remain covered with the interlayer insulating layer 53 (see FIG. 1B).

A part of the outer edge 21c of the film body 21 when viewed from the Z direction constitutes a connection portion 21d connected to the frame body 22. Meanwhile, the remaining part of the outer edge 21c excluding the connection portion 21d is separated from the frame body 22. A slit 25 is interposed between the remaining part of the outer edge 21c and the frame body. The remaining part of the outer edge 21c includes an opposite portion 21e which is located at the opposite side of the film body 21 to the connection portion 21d. That is, the film body 21 includes the connection portion 21d as a fixed end and the opposite portion 21e as a free end, and functions as a cantilever that is displaced (vibrated) in the Z direction. The film body 21 is formed together with the space 23 by etching a back surface 22b of the frame body 22 (the substrate 20), for example.

The frame body 22 has a frame-like shape surrounding the film body 21 when the substrate 20 is viewed from the Z direction. The frame body 22 has an inner surface 22c which faces the outer edge 21c of the film body 21 with the slit 25 therebetween. The inner surface 22c faces the outer edge 21c of the film body 21 with the slit 25 therebetween. Meanwhile, the space 23 surrounded by the back surface 21b of the film body 21 and the inner surface 22c of the frame body 22 is formed in the substrate 20. That is, the substrate 20 has a recess with the back surface 21b of the film body 21 as a bottom surface and the inner surface 22c of the frame body 22 as the side surface.

As shown in FIGS. 1B and 1C, the slit 25 penetrates through the substrate 20 via the space 23 in the Z direction. The width of the slit 25 is 10 μm, for example. The slit 25 is formed by etching one surface of the substrate 20 including the front surface (the first surface) 21a of the film body 21. Therefore, the width of the slit 25 can be set with high accuracy.

Further, the front surface 21a of the film body 21 and the front surface 22a of the frame body 22 are formed from one surface of the substrate 20 with the formation of the slit 25. If the deflection of the film body 21 is not taken into account, the heights of both surfaces in the Z direction coincide.

The lid body 40 is attached to the frame body 22 by adhesion and covers the front surface 21a of the film body 21 with a space (gap) 41 which will be described later therebetween. The lid body 40 is formed of a semiconductor material containing silicon (Si), for example. The lid body 40 has a front surface 40a and a back surface 40b which face in mutually opposite directions in the Z direction. An opening 43 is formed in the back surface 40b of the lid body 40. An inner surface (a recess) 44 of the opening 43 forms the space 41 in the lid body 40. The space 41 also communicates with the space outside the transducer 10A through a through-hole 42 formed in the front surface 40a. The through-hole 42 is overlapped with at least a part of the piezoelectric element 30 when viewed from the Z direction. The opening area of the through-hole 42 is smaller than the area of the film body 21. The opening areas of the opening 43 and the space 41 are larger than the area of the film body 21.

The inner surface 44 of the opening 43 makes contact with the film body 21 when the film body 21 is deformed. This contact prevents excessive deflection of the film body 21. In addition, leakage of gas from the slit 25, which will be described later, is also suppressed. However, it is also possible to omit the lid body 40 according to the specifications of the transducer.

As shown in FIG. 1B, the piezoelectric element 30 is arranged on the front surface 21a of the film body 21 to face the opening 43 of the lid body 40. The piezoelectric element 30 may be arranged on the front surface 22a of the frame body 22 and the front surface 21a of the film body 21 so that the piezoelectric element 30 spans the outer edge 21c of the film body 21.

The piezoelectric element 30 includes a pair of electrodes 31 and 33 and a piezoelectric film 32 interposed between the pair of electrodes 31 and 33. The pair of electrodes 31 and 33 and the piezoelectric film 32 have a shape corresponding to the shape of the film body 21.

On the front surface 21a of the film body 21, the electrode 31, the piezoelectric film 32, and the electrode 33 are sequentially laminated in the Z direction. The piezoelectric element 30 is formed on the film body 21 before the lid body 40 is attached to the frame body 22.

For example, when the transducer 10A is used as a speaker, the film body 21 is displaced due to the stretching and shrinking of the piezoelectric film 32 if a driving voltage is applied between the pair of electrodes 31 and 33. Specifically, the film body 21 is displaced such that the tip side of the film body 21 is warped in the Z direction.

By repeatedly applying a driving voltage to the pair of electrodes 31 and 33, the film body 21 is repeatedly displaced toward the space 23 and toward the space 41 in an alternating manner. That is, the film body 21 vibrates in the Z direction. Such vibration of the film body 21 causes the air around the film body 21 to vibrate, and thus sound waves are generated. The sound waves propagate to the space outside the transducer 10A through the through-hole 42 of the lid body 40.

The electrodes 31 and 33 are formed of an electrically conductive thin metal film such as platinum, molybdenum, iridium, or titanium, for example. The electrode 31 is located on the top surface of the piezoelectric film 32, and the electrode 33 is located below the bottom surface of the piezoelectric film 32.

The piezoelectric film 32 is made from lead zirconate titanate (PZT), for example. However, the piezoelectric film 32 may be made from aluminum nitride (AlN), zinc oxide (ZnO), or lead titanate ($PbTiO_3$).

The piezoelectric element 30 and the front surface 22a of the frame body 22 around the element are covered with a protection film (a first protection film) 57 containing alumina as a component, for example, as a protection film 56. Further, the region of the front surface 22a of the frame body 22 other than the region including the film body 21 and the piezoelectric element 30 is covered with a protection film (a second protection film) 58 containing tetraethoxysilane (TEOS) as a component, for example, as the protection film 56. The protection film 58 is formed to provide electrical insulation between the wires of the electrodes 31 and 33.

Figure 2:
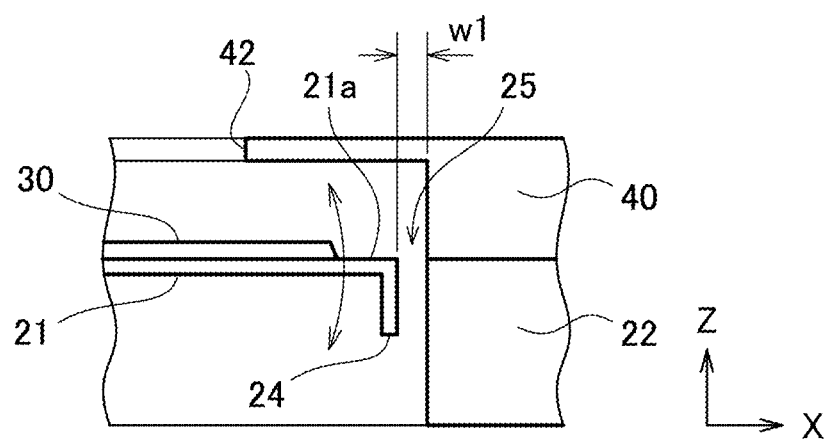
FIG. 2 is a cross-sectional view of the transducer which is taken along line II-II in FIG. 1A.
Figure 3A:
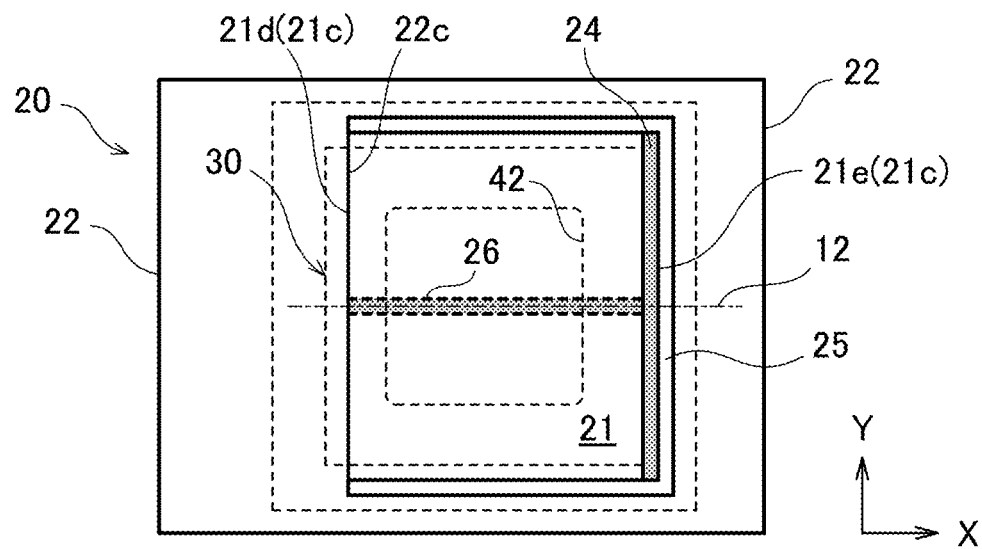
FIG. 3A is a rear view of a substrate according to the first embodiment.
Figure 3B:
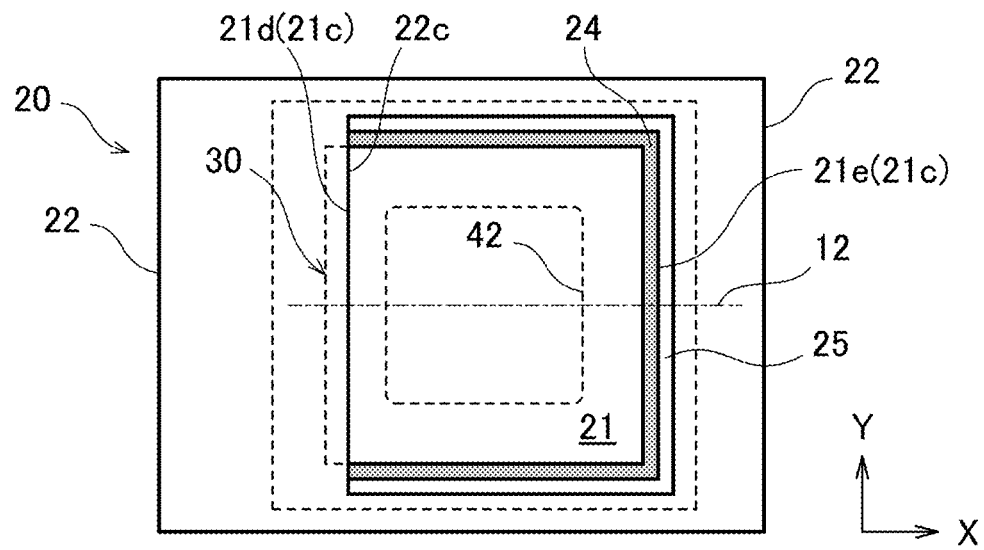
FIG. 3B is a rear view of the substrate according to the first embodiment.
Figure 3C:
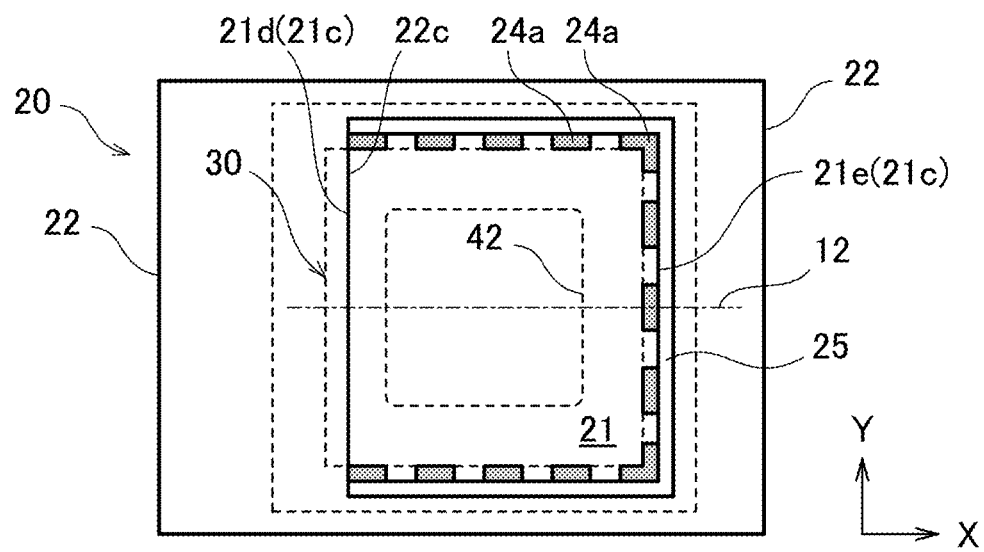
FIG. 3C is a rear view of the substrate according to the first embodiment.

The protrusion 24 according to the present embodiment will be described. FIG. 2 is a cross-sectional view of the transducer which is taken along line II-II in FIGS. 1A and 1s an enlarged view of the periphery of the opposite portion 21e of the film body 21. FIGS. 3A to 3C are rear views of the substrate 20.

As shown in FIG. 2, the substrate 20 has the protrusion 24. The protrusion 24 protrudes in the thickness direction of the film body 21 from a region including at least a portion of the remaining part of the outer edge 21c of the back surface 21b of the film body 21. The protrusion 24 is formed integrally with the film body 21 and protrudes from the outer edge 21c of the film body 21 toward the space 23 in the frame body 22. A gap between the protrusion 24 and the inner surface 22c of the frame body 22 is continuous with the slit 25.

As shown in FIG. 3A, the protrusion 24 is arranged at the opposite portion 21e which is located at the opposite side of the film body 21 to the connection portion 21d of the remaining part of the outer edge 21c of the film body 21 excluding the connection portion 21d, for example. Further, the protrusion 24 may extend along the outer edge 21c. Furthermore, when the film body 21 is viewed from the Z direction, a part of the interlayer insulating layer 53 is overlapped with the protrusion 24. When the thickness of the film body 21 is smaller than the original thickness of the active layer 51, a part of this interlayer insulating layer 53 is included in the protrusion 24.

The height of the protrusion 24 in the Z direction is set in consideration of the maximum amplitude of the film body 21 and the value of the width w1 of the slit 25. The height of the protrusion is 3 μm to several 100 μm, for example. The thickness of the protrusion 24 is set in consideration of the mechanical strength of the protrusion 24 and the weight of the film body 21. The thickness of the protrusion is 10 to 100 μm, for example. The thickness referred to here is the maximum length of the protrusion 24 in the direction parallel to the back surface 21b of the film body 21.

When the film body 21 vibrates to generate sound waves, gas flows between the space 23 and the space 41 through the slit 25. This change in pressure due to the flow (leakage) of gas has a phase which is the opposite of the phase of a change in sound pressure generated by the film body 21 and acts to cancel the sound pressure. Therefore, if the flow of the gas described above is excessively large, the sound pressure that should be obtained may not be obtained and the reproducibility of sound may deteriorate. For example, the amplitude of the vibration of the film body in a low frequency range is likely to be larger than that in a high frequency range. In this case, the cancellation of the sound pressure due to the flow of the gas is likely to occur.

However, according to the present embodiment, the gap having the width w1 defined by the slit 25 is extended in the Z direction by the protrusion 24. Therefore, compared with the case where the protrusion 24 is not provided, the change in the width of the slit 25 during vibration is suppressed and the flow of gas between the space 23 and the space 41 is suppressed. As a result, the cancellation of the above-described sound pressure is suppressed. For example, it is possible to increase the sound pressure in the low frequency range where the sound pressure is easily canceled. In other words, it is possible to enhance the reproducibility of the sound that should be obtained originally.

As shown in FIG. 3A, when the protrusion 24 is disposed at the opposite portion 21e, the substrate 20 may have at least one reinforcing portion 26. The reinforcing portion 26 protrudes in the Z direction (in other words, toward the space 23) from the back surface 21b of the film body 21 and is connected to the protrusion 24. Further, the reinforcing portion 26 extends from the protrusion 24 toward the connection portion 21d of the film body 21. For example, the reinforcing portion 26 is disposed on a straight line 12 of the film body 21 extending from the connection portion 21d of the film body 21 to the opposite portion 21e of the film body 21. The straight line 12 connects the center of the connection portion 21d with the center of the opposite portion 21e of the outer edge 21c which is located at the opposite side of the film body 21 to the connection portion 21d. If more than one reinforcing portions 26 are provided, the portions are provided parallel to the straight line 12.

The length of the reinforcing portion 26 may be equal to or shorter than the length from the opposite portion 21e to the connection portion 21d. The reinforcing portion 26 functions as a rib to prevent breakage due to excessive deformation of the protrusion 24. The reinforcing portion 26 prevents deflection of the film body 21, which causes unnecessary harmonics. Therefore, it is possible to increase the amplitude of the film body 21.

As shown in FIG. 3B, the protrusion 24 may be disposed along the entire remaining part of the outer edge 21c of the film body 21 excluding the connection portion 21d. In this case, the leakage of the gas described above is further suppressed. As shown in FIG. 3C, the protrusion 24 may have a plurality of protruding cells 24a divided along the outer edge 21c of the film body 21. In this case, compared with the example where the protrusion is disposed along the entire remaining part of the outer edge 21c described above, the weight of the film body 21 can be reduced and the elasticity of the film body 21 can be enhanced.

As shown in FIGS. 3A to 3C, the planar shape of the protrusion 24 viewed from the Z direction may be a linearly symmetric shape with the axis of symmetry being the straight line 12 connecting the center of the connection portion 21d and the center of the opposite portion 21e of the outer edge 21c facing the connection portion 21d. In this case, it is possible to suppress the deflection of the asymmetric film body 21 and the occurrence of unnecessary harmonics that accompany the deflection.

Next, a method of manufacturing the transducer 10A will be described. FIGS. 4A to 4J are diagrams showing a manufacturing process of the transducer 10A.

Figure 4A:
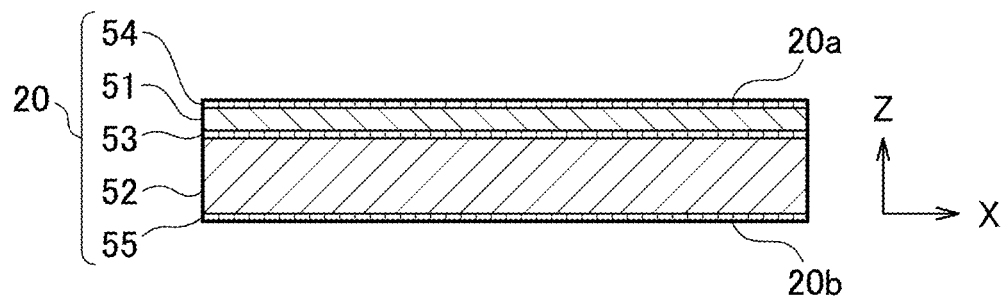
FIG. 4A is a diagram showing a manufacturing process of the transducer according to the first embodiment.
Figure 4B:
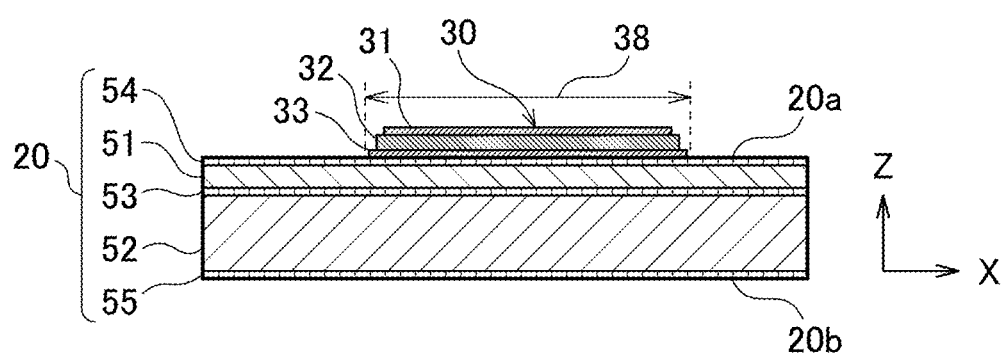
FIG. 4B is a diagram showing the manufacturing process of the transducer according to the first embodiment.

FIG. 4A shows the substrate 20 before the piezoelectric element 30 is formed. The substrate 20 is arranged on a support table (not shown) for manufacturing equipment while the back surface 20b is in contact with the support table (not shown). Then, as shown in FIG. 4B, a conductive layer which becomes the electrode 33, a piezoelectric material which becomes the piezoelectric film 32, and a conductive layer which becomes the electrode 31 are sequentially laminated in a set region 38 of the piezoelectric element 30 defined on the front surface 20a of the substrate 20, while performing etching or the like as appropriate, and accordingly the piezoelectric element 30 is formed.

Figure 4C:
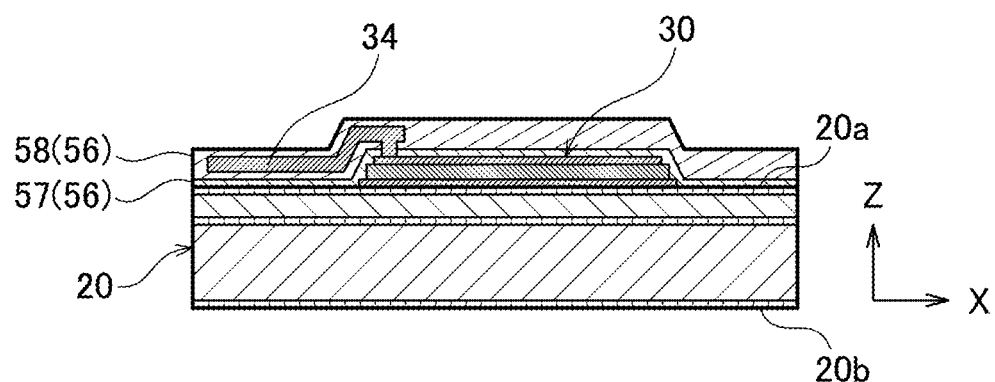
FIG. 4C is a diagram showing the manufacturing process of the transducer according to the first embodiment.

Then, as shown in FIG. 4C, a protection film 57 is formed on the piezoelectric element 30 and the front surface 20a around the element. The protection film 57 is a film containing alumina ($Al_2O_3$), and the thickness thereof is 80 nm, for example.

Next, the protection film 58 and wiring 34 are formed on the protection film 57. The protection film 58 is a film containing tetraethoxysilane (TEOS) (a TEOS film), for example. The protection film 58 is formed before and after the formation of the wiring 34, and the thickness thereof is 1.5 μm, for example. A chemical vapor deposition method such as a thermal CVD or plasma CVD method can be used as the method of manufacturing the TEOS film. The wiring 34 and the electrode 33 are electrically connected by forming a contact therebetween.

Figure 4D:
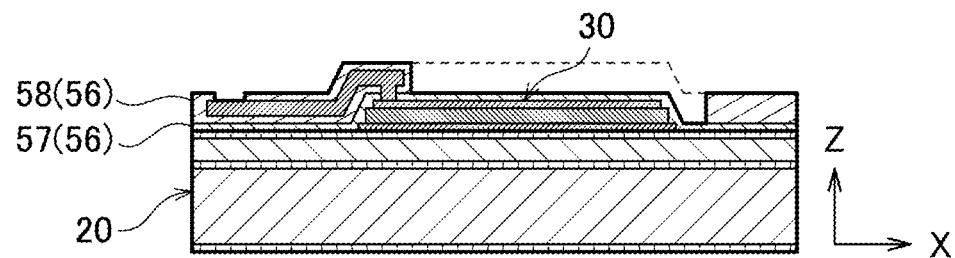
FIG. 4D is a diagram showing the manufacturing process of the transducer according to the first embodiment.

Next, as shown in FIG. 4D, the region including the formation positions of the piezoelectric element 30 and the slit 25 of the region of the protection film 58 is removed by means of etching. As a result, a vibration portion including the film body 21 becomes thin and weight is reduced. The protection film 58 may be etched by using a patterned resist as a mask by means of a general photolithography method. The resist is removed by oxygen plasma, sulfuric acid, or the like. Examples of the etching method of the protection film 58 include wet etching using hydrofluoric acid and dry etching such as reactive ion etching.

Figure 4E:
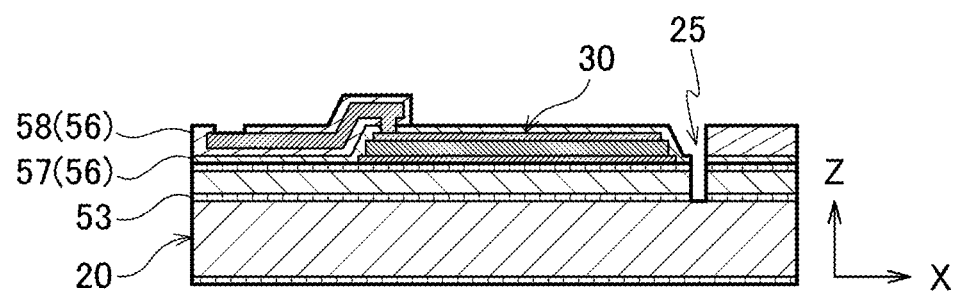
FIG. 4E is a diagram showing the manufacturing process of the transducer according to the first embodiment.

Next, as shown in FIG. 4E, the active layer 51 at the position where the slit 25 is to be formed is etched to form the slit 25. This etching is performed until the slit 25 reaches a predetermined depth (for example, a depth where the slit reaches the interlayer insulating layer 53). A silicon oxide film as a mask material is deposited on the active layer 51. A thermal CVD or plasma CVD method can be used as a deposition method. Next, the resist is patterned on the mask material. As a patterning method, a general photolithography method can be used. The mask material is etched by using the patterned resist as a mask. The mask material has an opening at the portion where the slit 25 is formed. As the etching method, dry etching such as reactive ion etching can be used.

Figure 4F:
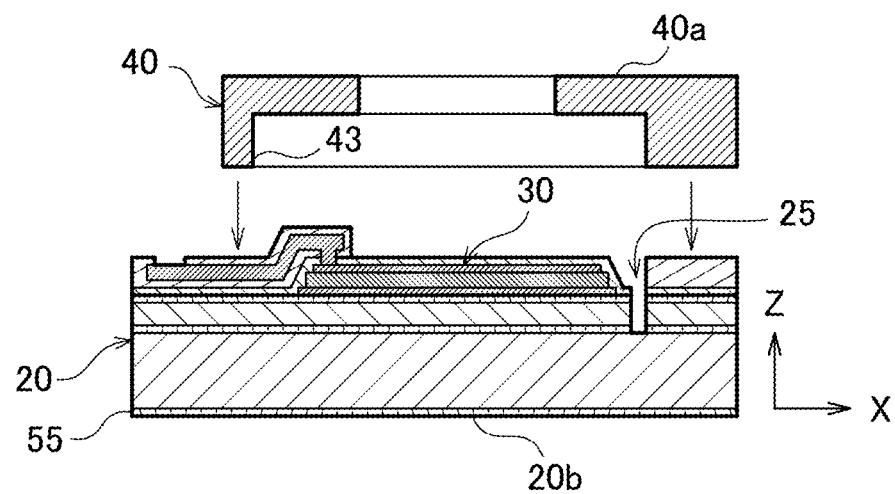
FIG. 4F is a diagram showing the manufacturing process of the transducer according to the first embodiment.

Next, as shown in FIG. 4F, the lid body 40 is attached to the substrate 20 by means of adhesion or the like. During this attachment, the protection film 56 is positioned between the lid body 40 and the substrate 20. By manipulating a support substrate (not shown) temporarily adhered to the front surface 20a of the lid body 40, the lid body 40 is positioned relative to the substrate 20 such that the opening 43 faces the region including the piezoelectric element 30 and the slit 25.

Figure 4G:
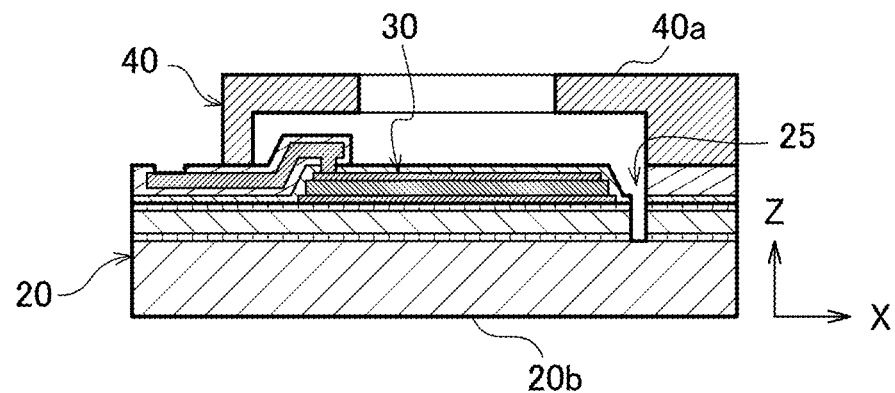
FIG. 4G is a diagram showing the manufacturing process of the transducer according to the first embodiment.

Then, the support table (not shown) is moved away from the back surface 20b of the substrate 20. Thereafter, as shown in FIG. 4G, the oxide film 55 formed on the back surface 20b is removed by means of etching.

Figure 4H:
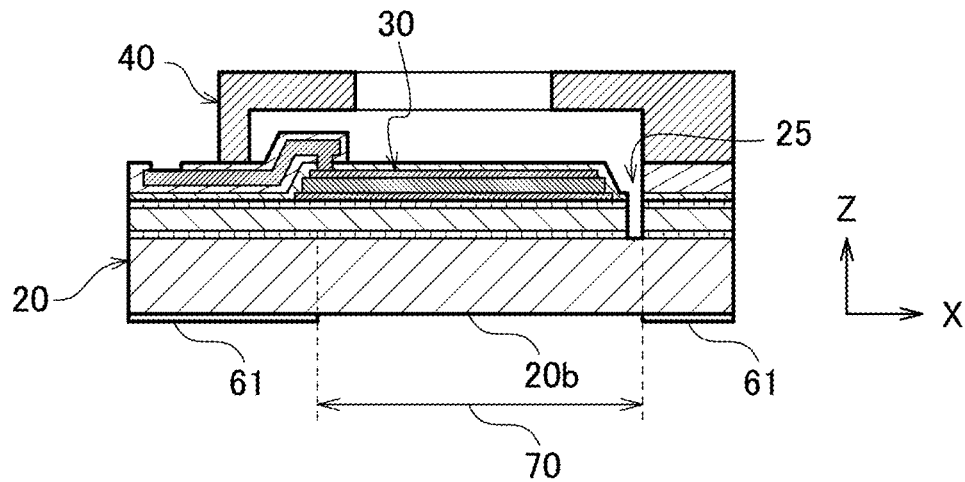
FIG. 4H is a diagram showing the manufacturing process of the transducer according to the first embodiment.

Next, a resist 61 is applied on the back surface 20b as shown in FIG. 4H. Thereafter, the resist 61 is removed from a region 70 corresponding to the film body 21 and slit 25 by using a general photolithography method.

Figure 4I:
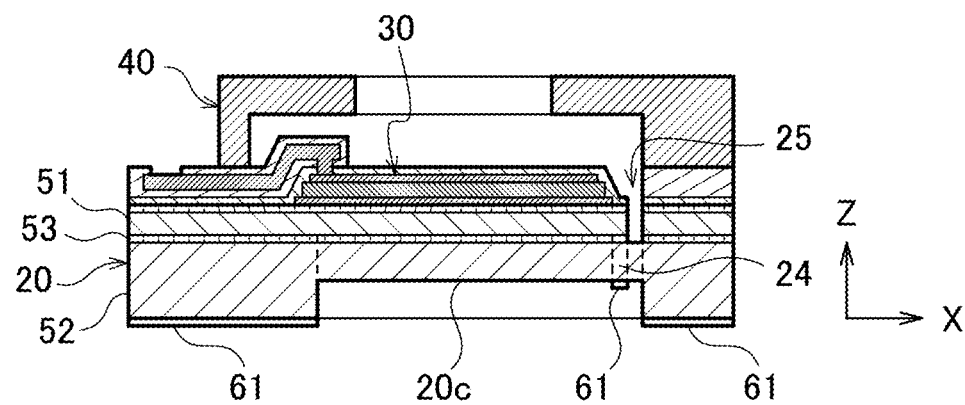
FIG. 4I is a diagram showing the manufacturing process of the transducer according to the first embodiment.

Then, as shown in FIG. 4I, the support layer 52 of the substrate 20 is etched (removed) by using the patterned resist 61 until a thickness approximately equal to the height of the protrusion 24 is obtained. Further, the resist 61 is applied again on a surface 20c of the substrate 20 formed by means of this etching, and patterning is performed such that the resist 61 remains only at the position corresponding to the protrusion 24. Then, the surface 20c is etched by using the patterned resist 61, and the support layer 52 and the interlayer insulating layer 53 are removed to form the protrusion 24 (see FIG. 4J). In this etching, a part of the active layer 51 may be removed according to the thickness of the film body 21. Alternatively, the interlayer insulating layer 53 may remain.

Figure 4J:
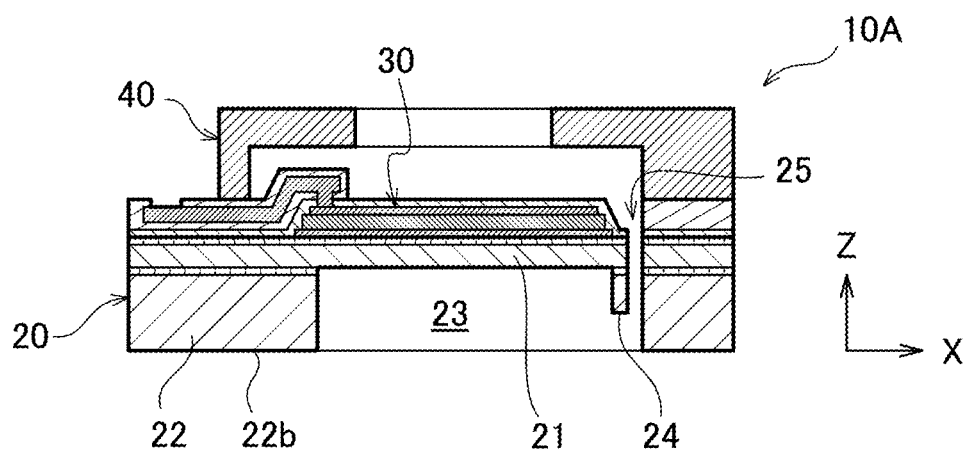
FIG. 4J is a diagram showing the manufacturing process of the transducer according to the first embodiment.

Next, as shown in FIG. 4J, all of the remaining resist 61 is removed. Thereafter, the support substrate (not shown) which supports the lid body 40 is removed from the front surface 40a as appropriate.

Second Embodiment

A second embodiment will be described.

The configuration of a transducer 10B according to the second embodiment is the same as that of the transducer 10A according to the first embodiment. Therefore, in the following descriptions, the differences between the first and second embodiments will be described, and configurations that are common between both embodiments are denoted with the same reference numerals and descriptions thereof will be omitted. The transducer 10B according to the second embodiment may or may not have the protrusion 24 (see FIG. 1B). In the drawings for the second embodiment, the protrusion 24 and the wiring 34 are omitted for convenience of the explanation.

Figure 5:
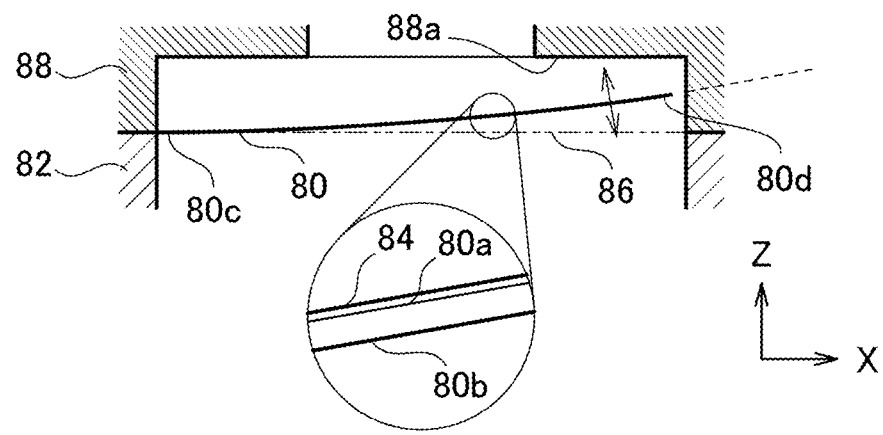
FIG. 5 is a diagram for explaining the warpage tendency of a film body due to an oxide film.

As described later, the warpage of the film body 21 is adjusted in the present embodiment. First, this warpage is described with reference to an example using a cantilever 80 having a thickness similar to that of the film body 21. FIG. 5 is a diagram for explaining the warpage tendency of the cantilever 80. For convenience of the explanation, the Z direction in the drawing is defined as the vertical direction, the X direction is defined as the horizontal direction, the upper side of the drawing is defined as the top, and the lower side of the drawing is defined as the bottom. Further, gravity and the internal stress of the cantilever 80 are not considered.

The cantilever 80 has a thickness similar to that of the film body 21 and has an upper surface 80a and a lower surface 80b which face in mutually opposite directions in the Z direction. The cantilever 80 extends in the X direction, only one end thereof is connected to the support portion 82, and the portion other than the one end is separated from all other members such as the support portion 82. That is, the cantilever 80 has a fixed end 80c connected to the support portion 82 and a free end 80d which is freely displaced in the Z direction.

The support portion 82 surrounds the cantilever 80 like the frame body 22. In addition, the cantilever 80 and the support portion 82 are integrally formed from a substrate containing silicon as a single member. If there is no external force applied to the cantilever 80, the upper surface 80a of the cantilever 80 and the upper surface 80a of the support portion 82 are positioned within the same reference surface 86.

Here, it is assumed that an oxide film 84 as the protection film is formed on the upper surface 80a of the cantilever 80. The oxide film 84 is formed when the cantilever 80 is manufactured. The cantilever 80 is heated during the formation of the oxide film 84. Therefore, when the temperature of the cantilever 80 decreases to the normal temperature, film stress (internal stress) is generated in the oxide film 84, the force thereof acts in the direction of shrinkage in the surface direction, and warpage in which the upper surface 80a warps inward occurs in the cantilever 80.

As a result, as shown in FIG. 5, the free end 80d of the cantilever 80 is displaced above the position obtained when there is no film stress (i.e., the position of the reference surface 86). Here, a case is supposed that an object 88, like the lid body 40 (cf. FIG. 1B), having an inner surface 88a which faces the cantilever 80 is disposed on the support portion 82. In this case, when the distance between the inner surface 88a and the free end 80d in the Z direction is smaller than the sum of the maximum amplitude of the cantilever 80 (the free end 80d) and the movement distance of the free end 80d in the Z direction caused by warpage, the possibility that the free end 80d comes into contact with the inner surface increases, and the maximum amplitude of the cantilever 80 (the free end 80d) is limited by the warpage of the cantilever 80.

The amount of warpage (the degree of warpage) of the cantilever 80 varies depending on the magnitude of the film stress of the film formed on the surface thereof. For example, a significant difference was observed in the amount of warpage of the cantilever 80 between when the oxide film 84 was formed by means of a thermal oxidation method and when the oxide film 84 was formed by means of the CVD method. This suggests that it is possible to adjust the amount of warpage of the cantilever 80 by controlling the film stress of the formed film.

If this is applied to the transducer according to the present embodiment, it is found that the amount of warpage of the film body 21 can be adjusted by controlling the film stress of materials, which are formed on the front surface (the first surface) 21a of the film body 21. Such materials in the present embodiment are the piezoelectric element 30 and the protection film 56.

As shown in FIG. 4C, the protection film 56 is formed on the piezoelectric element 30 and the front surface 20a of the substrate 20 around the element. The protection film 56 includes a protection film 57 containing alumina ($Al_2O_3$), or the protection film 57 and a protection film 58 containing tetraethoxysilane (TEOS). In the first embodiment, the protection film 58 on the piezoelectric element 30 is removed. However, as described later, the film may remain in the second embodiment. Further, the materials of the protection film 56 are not limited to those as described above, and the protection film 56 may include three or more films.

Figure 6A:
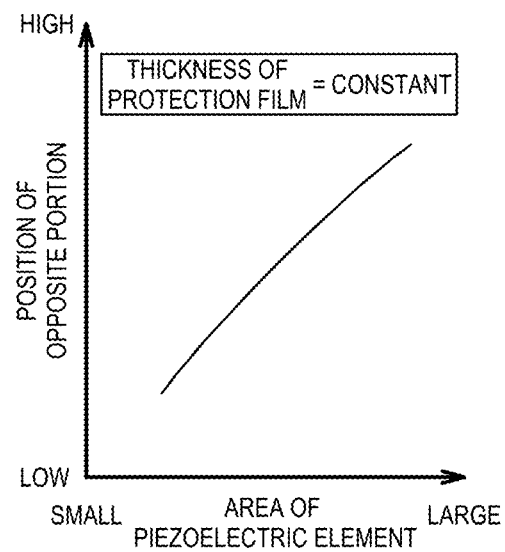
FIGS. 6A and 6B are diagrams for explaining the change in the amount of warpage of a film body due to a piezoelectric element and a protection film.
Figure 6B:
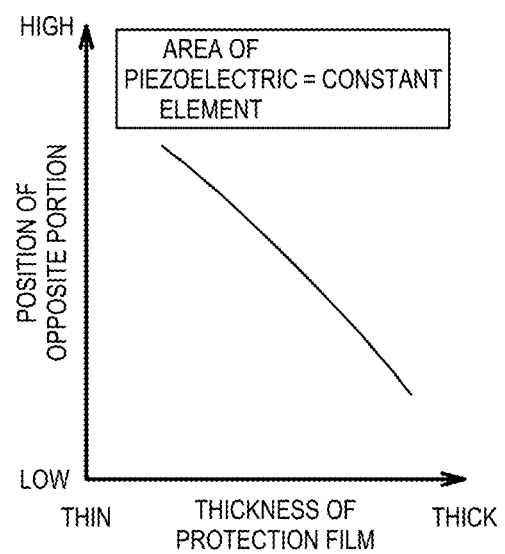

A description will be given regarding the change in the amount of warpage of the film body 21 due to the piezoelectric element 30 and the protection film 56. FIGS. 6A and 6B show the change in the neutral position of the opposite portion 21e of the film body 21 due to the change in the warpage of the film body 21. The neutral position of the opposite portion 21e is the position (height) of the opposite portion 21e in the Z direction in a state where external force due to the piezoelectric element 30 is not applied to the film body 21 (a neutral state).

First, a description will be given with reference to FIG. 6A. FIG. 6A is a diagram showing the change in the neutral position of the opposite portion 21e according to the area of the piezoelectric element 30. The vertical axis shows the neutral position of the opposite portion 21e in the Z direction, and the horizontal axis shows the area of the piezoelectric element 30. The area of the piezoelectric element 30 is changed by changing the position of an edge 30b (see FIG. 8A) of the piezoelectric element 30 close to the opposite portion 21e in the X direction while the position of an edge 30a (see FIG. 8A) of the piezoelectric element 30 close to the connection portion 21d is fixed. However, in all areas, the width of the piezoelectric element 30 along the connection portion 21d is constant and the thickness of the piezoelectric element 30 is also constant.

As shown in FIG. 6A, when the thickness of the protection film 56 is constant, the neutral position of the opposite portion 21e of the film body 21 increases in accordance with an increase in the area of the piezoelectric element 30.

Here, for convenience of the description, a degree of uneven distribution is defined. The degree of uneven distribution is an index indicating how close the piezoelectric element 30 is to the connection portion 21d and is defined by the ratio of a distance g2 to a distance g1 in the X direction (see FIG. 8A). The distance g1 is a distance from the center 38c of the set region 38 of the piezoelectric element 30 that is set on the substrate 20 including the front surface 21a, to the edge 30a of the piezoelectric element 30. The distance g2 is a distance from the center 38c of the set region 38 to the center 30c of the piezoelectric element 30. For example, when the degree of uneven distribution is zero, the piezoelectric element 30 is formed over the entire set region 38. When the degree of uneven distribution has a value other than zero, the center 30c of the piezoelectric element 30 is positioned close to the connection portion 21d from the center 38c of the set region 38. The neutral position of the opposite portion 21e rises as this degree of uneven distribution decreases.

Next, a description will be given with reference to FIG. 6B. FIG. 6B is a diagram showing the change in the neutral position of the opposite portion 21e according to the thickness of the protection film 56 (see FIGS. 8B, 9B, for example) which covers the piezoelectric element 30. The above described film thickness is the value obtained by spatially averaging the thickness of the protection film 56 on the film body 21. As shown in this diagram, when the area of the piezoelectric element 30 formed on the film body 21 is constant, the neutral position of the opposite portion 21e decreases as the thickness of the protection film 56 increases.

As described above, the neutral position of the opposite portion 21e rises when the area of the piezoelectric element 30 (the degree of uneven distribution of the piezoelectric element 30) increases. The neutral position of the opposite portion 21e decreases when the thickness of the protection film 56 increases. That is, the piezoelectric element 30 has a film stress that causes the film body 21 to warp with the back surface 21b on the inner side, while the protection film 56 has a film stress that causes the film body 21 to warp with the front surface 21a on the inner side. In other words, these film stresses act to warp the film body 21 in mutually opposite directions. Therefore, the amount and direction of warpage of the film body 21 in the neutral state can be controlled by changing the combination of the area (the degree of uneven distribution) of the piezoelectric element 30 and the thickness of the protection film 56.

First, the degree of uneven distribution of the piezoelectric element 30 is set, and the thickness of the protection film 56 is set considering this degree of uneven distribution, for example. Otherwise, a thickness of the protection film 56 may be set, and the degree of uneven distribution of the piezoelectric element 30 may be set considering this film thickness. In both cases, the thickness of the protection film 56 is set to a value at which the protection film 56 extends from the connection portion 21d to the opposite portion 21e either linearly or while warping toward the back surface 21b (with the back surface 21b on the inner side) due to the resultant force of the film stress of the protection film 56 and the film stress of the piezoelectric element 30.

Figure 7A:
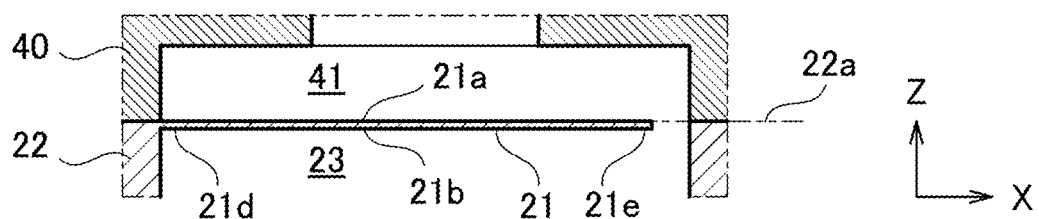
FIGS. 7A and 7B are diagrams showing the amount of warpage of a film body and a neutral position of an opposite portion of a film body according to a second embodiment.
Figure 7B:
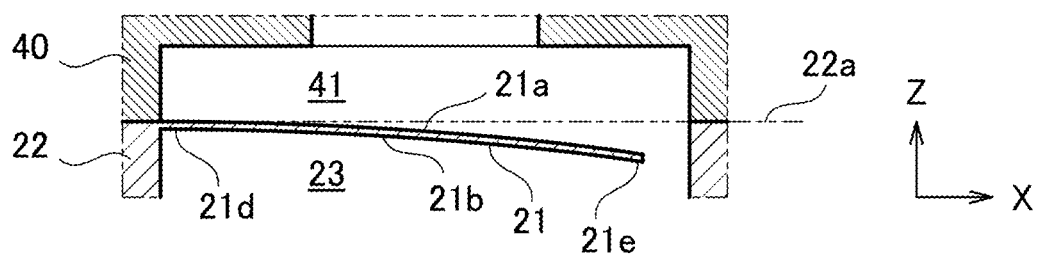

As a result, as shown in FIGS. 7A and 7B, the film body 21 coincides with the front surface 22a of the frame body 22, or the film body 21 warps with the back surface 22b on the inner side (warps into the space 23 in the frame body 22). Since the neutral position of the opposite portion 21e is positioned in the space 23 in the frame body 22, the distance between the neutral position of the opposite portion 21e and the inner surface 44 of the lid body 40 increases compared with the case where the film body 21 warps with the front surface 21a on the inner side. This can enhance the movable range of the film body 21. For example, when the transducer 10B is used as a speaker, it is possible to increase the maximum amplitude of the film body 21 according to the voltage applied to the piezoelectric element 30, and it is possible to enhance the dynamic range and sound reproducibility. Alternatively, when the transducer 10B is used as a microphone, it is possible to increase the maximum amplitude of the film body 21 and enhance the dynamic range of the sound pressure to be detected.

Since the film body 21 in the neutral state is positioned in the space 23 in the frame body 22, there is a reduction in the portion of the piezoelectric element 30 that protrudes (is exposed) toward the lid body 40 relative to the front surface 22a of the frame body 22. Therefore, the contact of the lid body 40 with the piezoelectric element 30 or the like can be avoided or the probability of contact can be reduced when the lid body 40 is adhered to the frame body 22. Further, there is some margin in the depth of the space 41 in the lid body 40, and therefore the height of the lid body 40 in the Z direction can be reduced. That is, it is possible to reduce the size of the transducer 10B.

Figure 8A:
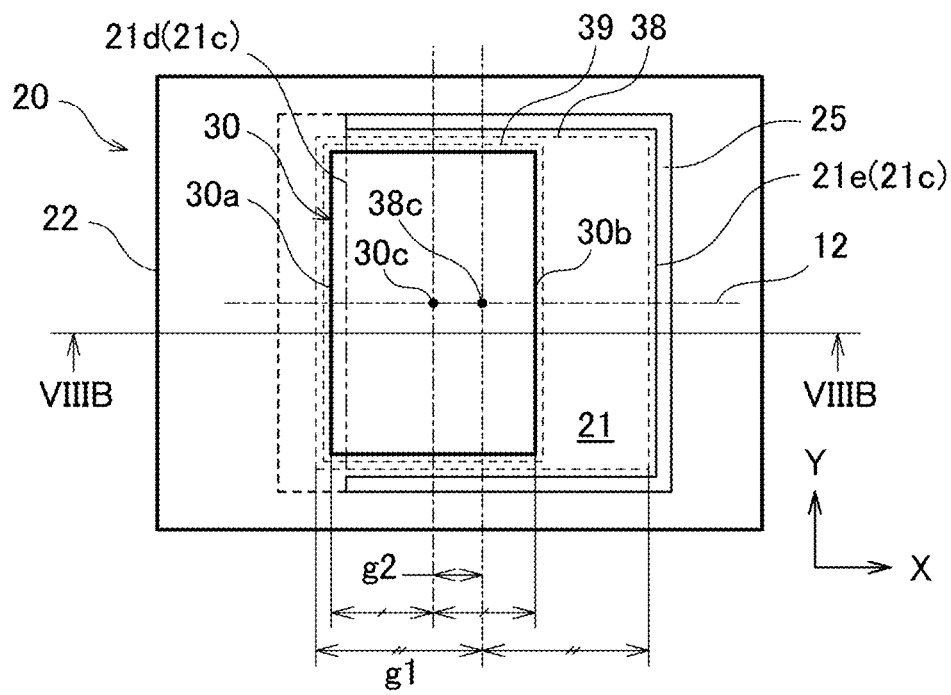
FIG. 8A is a top view of a substrate according to a first example of the second embodiment.
Figure 8B:
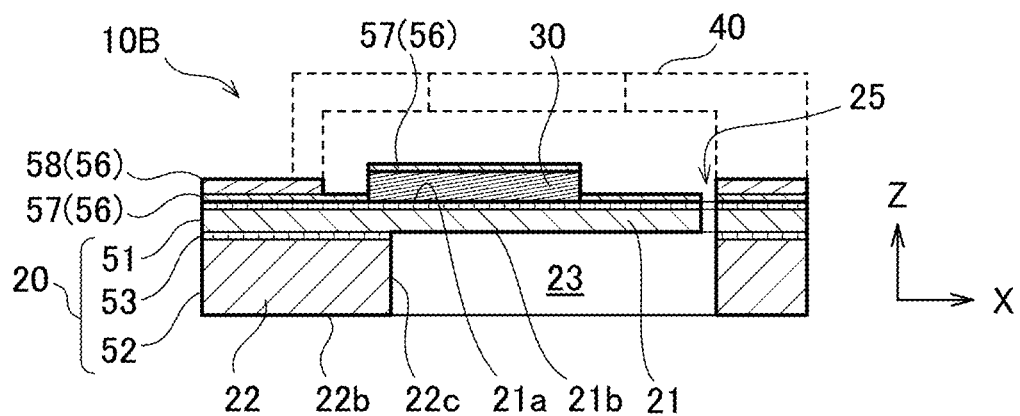
FIG. 8B is a cross-sectional view of the substrate which is take along line VIIIB-VIIIB in FIG. 8A.

FIG. 8A is a top view of the substrate 20 according to a first example of the present embodiment. FIG. 8B is a cross-sectional view of the substrate which is taken along line VIIIB-VIIIB in FIG. 8A. As shown in FIG. 8A, the piezoelectric element 30 is unevenly distributed in a region 39 close to the connection portion 21d of the front surface 21a of the film body 21. As shown in FIG. 8B, the protection film 56 covers the unevenly distributed piezoelectric element 30 and the front surface 21a of the film body 21 around the element (in other words, a portion of the front surface 21a where the piezoelectric element 30 is not located). In the process shown in FIG. 4B, the piezoelectric element 30 is formed at a position on the front surface 20a of the substrate 20 where the desired degree of uneven distribution is obtained.

Compared with a case where the formation area of the piezoelectric element 30 is set to the maximum (the case where the degree of uneven distribution is zero), the rising of the opposite portion 21e is suppressed by an increase in the degree of uneven distribution, and there is a decrease in the thickness of the protection film 56 required to obtain a state in which the film body 21 linearly extends or warps with the back surface 21b on the inner side. Therefore, it is possible to reduce the weight of the entire film body 21, piezoelectric element 30, and protection film 56. In the example shown in FIG. 8B, only the protection film 57 is formed in the set region 38 as the protection film 56. However, a protection film 58 of a desired thickness may be formed (may remain) on the protection film 57 according to the film stress that is set.

Figure 9A:
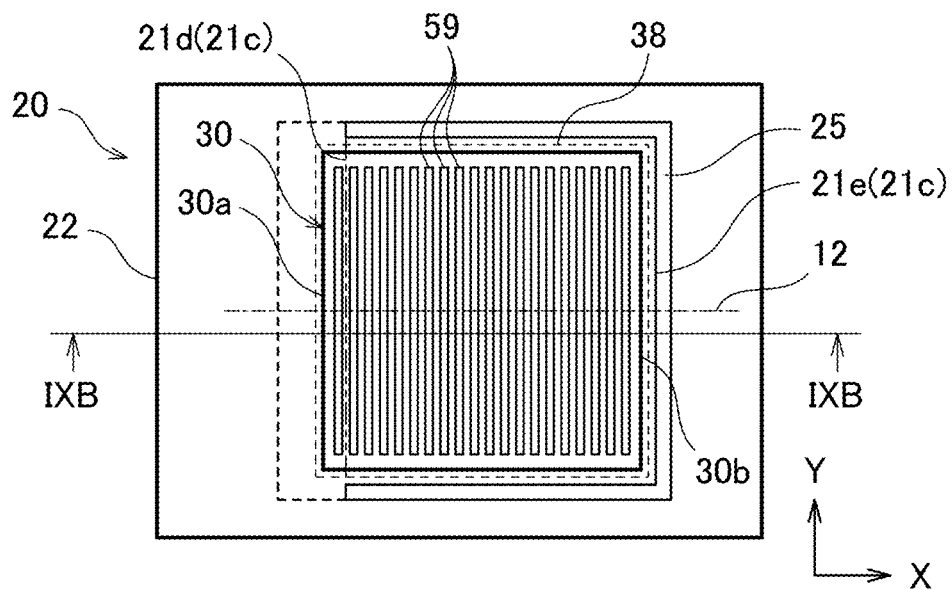
FIG. 9A is a top view of the substrate according to a second example of the second embodiment.
Figure 9B:
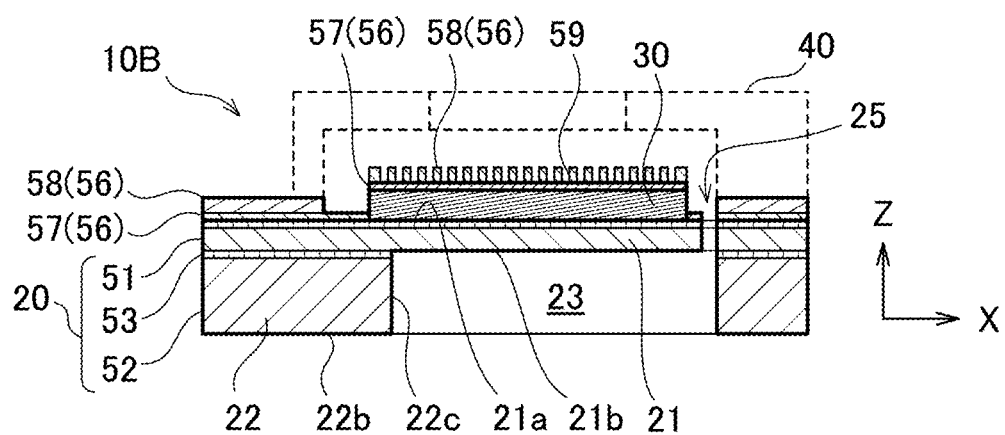
FIG. 9B is a cross-sectional view of the substrate which is taken along line IXB-IXB in FIG. 9A.
Figure 9C:
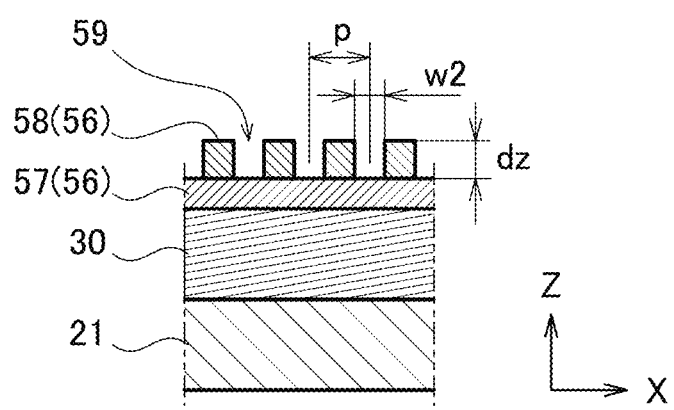
FIG. 9C is a partial enlarged view of cross sections of the film body and a protection film shown in FIG. 9B.

FIG. 9A is a top view of the substrate 20 according to a second example of the present embodiment. FIG. 9B is a cross-sectional view of the substrate which is taken along line IXB-IXB in FIG. 9A. FIG. 9C is a partial enlarged view of cross sections of the film body 21 and the protection film 56 shown in FIG. 9B. As shown in FIG. 9A, the piezoelectric element 30 is formed over the entire surface of the set region 38. Meanwhile, the protection film 56 on the piezoelectric element 30 includes recesses 59.

The recesses 59 are spaced apart in the direction from the connection portion 21d of the outer edge 21c of the film body 21 toward the opposite portion 21e of the outer edge 21c (for example, in the X direction), and extend in a direction (for example, in the Y direction) that intersects the direction from the connection portion 21d of the outer edge 21c toward the opposite portion 21e of the outer edge 21c. That is, as shown in FIG. 9A, the recesses 59 are formed on the piezoelectric element 30 in a stripe-like manner. The recesses 59 are formed by forming a patterned resist on the protection film 56 and etching the protection film 56. For example, when the protection film 58 shown in FIG. 4D is removed, a patterned resist is formed on the protection film 58, and the protection film 58 at locations that become the recesses 59 is etched.

According to this example, the average value of the thickness of the protection film 56 is reduced by the formation of the recesses 59. That is, the film stress of the protection film 56 can be changed merely by forming the recesses 59. The decreasing width of the average value of the film thickness can be adjusted as appropriate by setting the depth dz, width w2, or pitch p (FIG. 9C) of the recesses 59. When the protection film 56 includes a plurality of protection films made from materials with different etching rates like the protection film 57 and the protection film 58, the recesses 59 are formed so that the protection film (the protection film 57 in this example) below the uppermost protection film (the protection film 58 in this example) is exposed from the uppermost protection film, for example. In this case, the depth dz of the recesses 59 is equal to the thickness of the uppermost protection film, and therefore it becomes easy to control the etching performed on the uppermost protection film.

In this example also, the piezoelectric element 30 may be unevenly distributed as in the first example. Due to the uneven distribution of the piezoelectric element 30 and the formation of the recesses 59, the variable range of the resultant force of the film stresses of the piezoelectric element 30 and the protection film 56 is increased, and it becomes easy to set the resultant force according to the size of the film body such as the film thickness.

The piezoelectric element 30 and the protection film 56 may be positioned in a linearly symmetrical manner with the straight line 12 as the axis of symmetry when viewed from the Z direction. In this case, the resultant force of the film stresses of the piezoelectric element 30 and the protection film 56 can be easily applied to the film body 21 in a linearly symmetrical manner with the straight line 12 as the axis of symmetry, and linearly symmetrical warpage of the film body 21 can be easily obtained.

Similarly, the recesses 59 may be positioned in a linearly symmetrical manner with the straight line 12 as the axis of symmetry. In this case also, the resultant force of the film stresses of the piezoelectric element 30 and the protection film 56 can be easily applied to the film body 21 in a linearly symmetrical manner with the straight line 12 as the axis of symmetry, and linearly symmetric warpage of the film body 21 can be easily obtained.

Each of the recesses 59 are not limited to a shape that has a constant width and extends in one direction. That is, as long as the desired warpage of the film body 21 can be obtained, each recess 59 may have a shape such as circular, elliptical, rectangular, or other polygonal shape when viewed from the Z direction.

As described above, the transducer 10B according to the second embodiment includes the substrate 20 containing silicon and the piezoelectric element 30 disposed on the substrate 20. The substrate 20 includes the film body 21 which has the first surface (the front surface) 21a and the second surface (the back surface) 21b which face in mutually opposite directions in a thickness direction (Z direction), and the frame body 22 which surrounds the film body 21 when the film body 21 is viewed from the thickness direction. The piezoelectric element 30 is disposed on at least a part of the first surface 21a of the film body 21. The piezoelectric element 30 and the first surface 21a around the element are covered by the protection film 56. A part of the outer edge 21c of the film body 21 when viewed from the thickness direction forms the connection portion 21d connected to the support portion 82, and the remaining part of the outer edge 21c excluding the connection portion 21d is separated from the frame body 22 and includes the opposite portion 21e which is located at the opposite side of the film body 21 to the connection portion 21d. The thickness of the protection film 56 is set to a value at which the protection film 56 extends from the connection portion 21d toward the opposite portion 21e either linearly or while warping with the second surface 21b on the inner side due to the resultant force of the film stress of the protection film 56 and the film stress of the piezoelectric element 30.

The substrate 20 may include a semiconductor layer and an oxide layer which are laminated on each other in the Z direction. As described above, in the present embodiment, the semiconductor layer forms the active layer 51 and the support layer 52, and the oxide layer forms the interlayer insulating layer 53.

The piezoelectric element 30 may be unevenly distributed in a region of the first surface 21a close to the connection portion 21d.

The protection film 56 may include the recesses 59.

The recesses 59 may be spaced apart in the direction from the connection portion 21d of the outer edge 21c toward the opposite portion 21e of the outer edge 21c, and extend in a direction that intersects the direction from the connection portion 21d of the outer edge 21c toward the opposite portion 21e of the outer edge 21c.

When viewed from the thickness direction, the piezoelectric element 30 and the protection film 56 may be positioned in a linearly symmetrical manner with the axis of symmetry being the straight line 12 connecting the center of the connection portion 21d with the center of the opposite portion 21e of the outer edge 21c which is located at the opposite side of the film body 21 to the connection portion 21d.

The transducer 10B may further include the lid body 40 which is adhered to the frame body 22 and covers the first surface 21a of the film body 21 with the space 41 therebetween. The lid body 40 may have the opening that is overlapped with at least a portion of the piezoelectric element 30 when viewed from the thickness direction.

The protection film 56 may include the protection film (the first protection film) 57 which covers the piezoelectric element 30 and the surface of the frame body 22 around the element, and the protection film (the second protection film) 58 which covers the protection film 57.

The protection film 58 may cover the region other than the region including the film body 21 and the piezoelectric element 30 (for example, the region facing the set region 38 or the opening 34), of the region covered with the protection film 57

The protection film 57 may contain alumina as a component.

The protection film 58 may contain tetraethoxysilane as a component.

When the protection film 56 includes the protection film 57, the protection film 58, and the plurality of recesses 59, each recess 59 may have a depth equal to the thickness of the protection film 58.

The piezoelectric element 30 may be disposed on the frame body 22 and the film body 21 so that the piezoelectric element spans the connection portion 21d of the film body 21.

Further, a part of the outer edge 21c of the film body 21 when viewed from the Z direction forms the connection portion 21d connected to the frame body 22, and the remaining part of the outer edge 21c excluding the connection portion 21d is separated from the frame body 22. In this case, the substrate 20 may have the protrusion 24 which protrudes in the Z direction from the region including at least a part of the remaining part of the outer edge 21c described above.

The invention claimed is:

1. A transducer comprising:
a substrate containing silicon; and
a piezoelectric element disposed on the substrate, wherein the substrate includes:
 a film body including a first surface and a second surface facing in mutually opposite directions in a thickness direction of the substrate; and
 a frame body surrounding the film body when the film body is viewed from the thickness direction,
the piezoelectric element is disposed on the first surface of the film body,
a part of an outer edge of the film body when viewed from the thickness direction forms a connection portion connected to the frame body, and a remaining part of the outer edge excluding the connection portion is separated from the frame body,
the substrate includes a protrusion protruding in the thickness direction from a region including at least a part of the remaining part of the outer edge of the second surface,
the protrusion is disposed at an opposite portion of the outer edge that is located at an opposite side of the film body to the connection portion of the remaining part of the outer edge, and
the substrate includes a reinforcing portion that protrudes from the second surface in the thickness direction and is connected to the protrusion.

2. The transducer according to claim 1, wherein
the substrate includes a semiconductor layer and an oxide layer that are laminated on each other in the thickness direction.

3. The transducer according to claim 1 further comprising:
a lid body that is attached to the frame body and covers the first surface of the film body with a space between the lid body and the first surface of the film body.

4. The transducer according to claim 3, wherein
the lid body includes an opening overlapped with at least a part of the piezoelectric element when viewed from the thickness direction.

5. The transducer according to claim 1, wherein
the protrusion is disposed along the entire remaining part of the outer edge.

6. The transducer according to claim 1, wherein
the protrusion includes a plurality of protruding cells divided along the outer edge.

7. The transducer according to claim 1, wherein
a planar shape of the protrusion viewed from the thickness direction is a linearly symmetric shape having, as an axis of symmetry, a straight line which connects a center of the connection portion and a center of the opposite portion of the outer edge which is located at the opposite side of the film body to the connection portion.

8. The transducer according to claim 1, wherein
a height of the protrusion in the thickness direction is 3 μm or more.

9. The transducer according to claim 1, wherein
a maximum length of the protrusion in a direction parallel to the second surface of the film body is 10 μm to 100 μm.

10. The transducer according to claim 1, wherein
the piezoelectric element is disposed on the frame body and the film body so that the piezoelectric element spans the connection portion.

11. The transducer according to claim 2, wherein
when the film body is viewed from the thickness direction, a part of the oxide layer is overlapped with the protrusion.

12. The transducer according to claim 11, wherein
a part of the oxide layer is included in the protrusion.

13. The transducer according to claim 3, wherein
the lid body is attached to the frame body with a protection film formed on the substrate therebetween.

14. The transducer according to claim 13, wherein
the protection film includes a first protection film covering the piezoelectric element and a surface of the frame body around the piezoelectric element, and a second protection film covering a region of the surface of the frame body other than a region including the film body and the piezoelectric element.

15. The transducer according to claim 14, wherein the first protection film contains alumina as a component.

16. The transducer according to claim 14, wherein the second protection film contains tetraethoxysilane as a component.

* * * * *